United States Patent [19]

Estrada

[11] Patent Number: 5,013,938

[45] Date of Patent: May 7, 1991

[54] ECL CUTOFF DRIVER CIRCUIT WITH REDUCED STANBY POWER DISSIPATION

[75] Inventor: Julio R. Estrada, South Portland, Me.

[73] Assignee: National Semiconductor Corporation, Santa Clara, Calif.

[21] Appl. No.: 430,431

[22] Filed: Nov. 1, 1989

[51] Int. Cl.$^5$ .............................................. H03K 3/01
[52] U.S. Cl. .................................... 307/455; 307/544; 323/315
[58] Field of Search ............ 307/455, 544, 467, 296.3; 323/315, 316, 317

[56] References Cited

U.S. PATENT DOCUMENTS

| | | | |
|---|---|---|---|
| 4,517,476 | 5/1985 | Barre | 307/455 |
| 4,617,478 | 10/1986 | Varadarajar | 307/355 |
| 4,639,661 | 1/1987 | Williams et al. | 307/455 |
| 4,713,560 | 12/1987 | Herndon | 307/455 |
| 4,795,916 | 11/1989 | Liron | 307/355 |
| 4,877,977 | 10/1989 | Kokado | 307/455 |
| 4,942,369 | 7/1990 | Nakagawara et al. | 307/316 |

FOREIGN PATENT DOCUMENTS

| | | | |
|---|---|---|---|
| 0030219 | 3/1980 | Japan | 307/455 |
| 0055727 | 4/1985 | Japan | 307/455 |

Primary Examiner—David Hudspeth
Assistant Examiner—Scott A. Ouellette
Attorney, Agent, or Firm—Lee Patch; Daniel H. Kane

[57] ABSTRACT

The output enable (OE) cutoff driver gate of a cutoff driver circuit is coupled to receive OE signals of high and low potential and hold an ECL logic gate in the cutoff state in response to one of the high and low OE signals. An OE signal driver circuit provides the OE signals of high and low potential to the OE cutoff driver gate. The OE cutoff driver current sink for sinking current from the OE cutoff driver gate is provided by a current switch circuit for switching sinking current on and off in response to current switch signals of high and low potential in phase with the OE signals. The current switch circuit switches on sinking current when the OE cutoff driver gate is holding the ECL logic gate in the cutoff state. The current switch circuit switches off sinking current for reducing power dissipation when the ECL logic gate is out of the cutoff state. The current switch circuit is provided by a current mirror circuit. A first emitter follower output buffer delivers OE signals from an OE input gate to the OE cutoff driver gate. A second emitter follower output buffer delivers current switch signals from the OE input gate to the current mirror circuit in phase with the OE signals.

19 Claims, 4 Drawing Sheets

FIG 2A

ECL CUTOFF DRIVER CIRCUIT WITH REDUCED STANBY POWER DISSIPATION

TECHNICAL FIELD

This invention relates to a new cutoff driver circuit for holding ECL logic gates and circuits in the cutoff state. The cutoff driver circuit reduces power requirements and power dissipation when the cutoff driver circuit is standing by and the ECL logic gates and circuits are out of the cutoff state for propagating ECL data signals. In particular the invention provides new cutoff driver circuits with a current sink current switch circuit.

BACKGROUND ART

Figure 1:
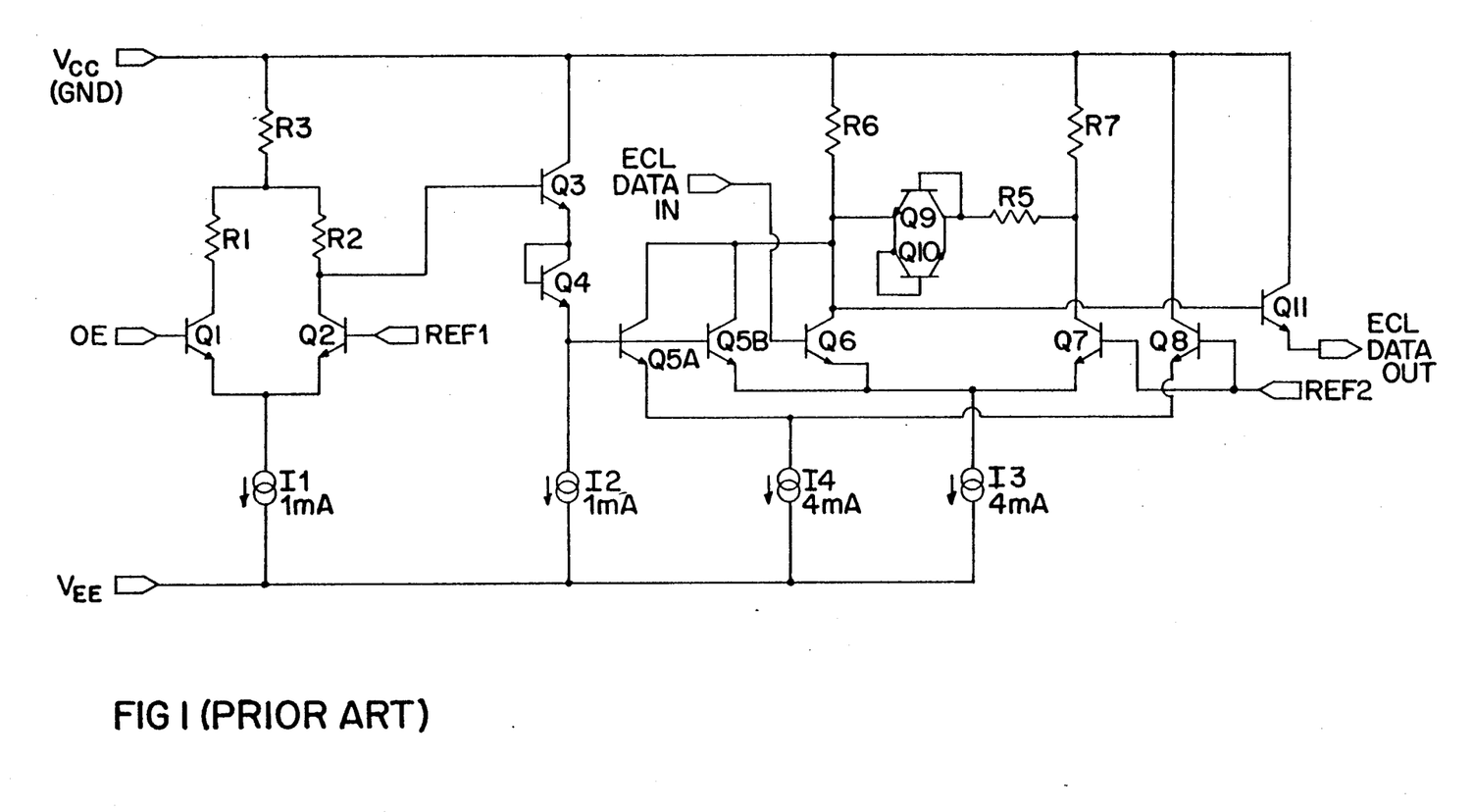
FIG. 1 is a schematic circuit diagram of a prior art ECL logic gate with cutoff driver circuit.

A standard ECL logic gate with an ECL cutoff driver circuit is illustrated in FIG. 1. The basic ECL gate is a differential gate provided by the ECL gate transistors Q6 and Q7. In this example gate transistor Q6 provides an input transistor element for receiving ECL data input signals of high and low potential at the input ECL DATA IN. Gate transistor Q7 provides a reference transistor element to which a reference voltage signal REF2 is applied at an intermediate reference voltage level between the high and low potential ECL data input signal levels. The emitter terminals of differential gate transistor elements Q6 and Q7 are coupled together at a common emitter node coupling. Current sink I3 is coupled between the common emitter node coupling and the low potential level power rail designated $V_{EE}$.

The current sink I3 is typically a current source transistor element with a tail resistor in its emitter current path for generating the sink current or tail current. A bias voltage generator provides the current source voltage applied to the base of the current source transistor element of the current sink I3.

The ECL differential gate transistor elements Q6 and Q7 provide alternative current paths through respective collector path swing voltage resistors R6 and R7 which are in turn coupled to the high potential level power rail. In this example the high potential level power rail $V_{CC}$ is at ground potential, and is also designated GND. Typically the swing voltage resistor elements R6 and R7 have substantially equal resistance. Current sink I3 generates the ECL differential gate current in one of the alternative current paths through either of the swing resistors R6 or R7 according to the input signal ECL DATA IN at the base of input transistor element Q6.

Typical ECL gates may also be constructed according to the differential signal input configuration with differential base input circuits. In the differential signal input ECL gate circuit configuration, the differential gate transistors Q6 and Q7 constitute differential input transistors for complementary inputs IN and DN rather than functioning as an input transistor element and reference transistor element as illustrated. Either type of gate is referred to herein as an ECL differential gate, ECL logic gate, or ECL output gate, or simply a differential gate or ECL gate.

As further shown in FIG. 1 the ECL gate output signals are taken from the collector node of gate transistor Q6. The collector node is an output switching node which provides output signals of high and low potential through output buffer emitter follower transistor element Q11 to the output ECL DATA OUT. While the collector node of gate transistor Q6 provides the complemented or inverted output signal for an input signal at ECL DATA IN, a true or non-inverted output signal, not shown, may also be taken from the collector node of gate transistor Q7.

The conventional output cutoff driver circuit for the ECL differential gate is provided by an output enable (OE) differential gate referred to herein as the OE cutoff driver gate. The OE cutoff driver gate includes OE gate transistor elements Q5 and Q8 in which transistor element Q5 provides the OE signal input transistor element or cutoff driver transistor element, and transistor element Q8 provides the OE reference transistor element. The OE gate transistor elements Q5 and Q8 are coupled together at a common emitter node coupling, and current sink I4 is coupled between the common emitter node coupling of OE gate transistor elements Q5 and Q8 and the low potential power rail $V_{EE}$. OE signal input transistor element or cutoff driver transistor element Q5 is a multiemitter transistor element or a pair of parallel coupled cutoff driver transistor elements Q5A and Q5B as shown in FIG. 1, with emitter nodes coupled respectively to current sinks I4 and I3 for supplying both current sinks during the cutoff state as hereafter described.

During normal switching operation of the ECL output gate and the output switching node of ECL gate transistor element Q6, the OE signal applied at the base of cutoff transistor elements Q5A and Q5B is low and OE cutoff driver transistor elements Q5A and Q5B are off. The OE reference transistor element Q8 therefore carries the tail current for current sink I4. For the cutoff state, the OE signal applied at the base of cutoff transistor elements Q5A and Q5B is high and OE cutoff driver transistor elements Q5A and Q5B turn on. With transistor elements Q5A and Q5B conducting, the emitter currents satisfy both the current sinks I3 and I4, turning off transistor elements Q7 and Q8. The total sinking current through both current sinks I3 and I4 is forced through load resistor element R6. The abnormally large current causes a large voltage drop across resistor element R6. As a result, the voltage level at the collector node of ECL gate input transistor Q6 and the output ECL DATA OUT drops below the cutoff potential level, approaching a load termination voltage $V_{TT}$ of, e.g. $-2v$. The ECL gate output ECL DATA OUT is therefore held in the cutoff or high impedance state for applications with multiple ECL output gates on a common bus. In common bus applications, one ECL output gate may be in the active switching mode while the others are held in the cutoff or high impedance state.

One disadvantage of the conventional ECL gate OE cutoff driver circuit is the large power dissipation required in both the cutoff state and when the cutoff driver circuit is idling or standing by. Power dissipation increases as the number of ECL output gates or ECL logic gates controlled by the OE cutoff driver circuit increases, forcing an increasing number of large currents through load resistors. A high power OE driver or OE signal source is also required to drive multiple bit circuits for multi-bit ECL output gates such as hex-buffers or octal buffers.

As shown in FIG. 1 the OE driver circuit, also referred to herein as the OE signal circuit includes an OE input gate provided by OE input transistor element Q1 to which OE input signals of high and low potential are applied, and the OE reference transistor element Q2 to which a reference signal REF1 of intermediate potential is applied. The OE input gate transistor elements Q1 and Q2 are coupled in a differential gate with a common emitter node. An OE input gate current sink I1 is coupled between this common emitter node and the low potential power rail $V_{EE}$. The OE input gate transistor elements Q1 and Q2 provide alternative collector resistor current paths through either of the collector resistors R1 and R2 and the common resistor element R3 from the high potential power rail $V_{CC}$ according to the OE signals applied at the base of the OE input transistor element Q1.

In this example the OE output signal from the OE input gate is taken from the collector node of OE reference transistor element Q2 which provides a switching output node coupled to the emitter follower output buffer transistor element Q3. The emitter follower output buffer transistor element Q3 is coupled through base collector shorted (BCS) transistor element diode Q4 to the base nodes of the OE cutoff driver transistor elements Q5A and Q5B. The output buffer emitter follower transistor element Q3 and the base node of the cutoff driver transistor elements Q5A and Q5B are referenced to the low potential power rail $V_{EE}$ through current sink I2.

The currents required for operation of the OE driver circuit or OE signal circuit provided by current sinks I1 and I2 are relatively small. Each of the current sinks I1 and I2 operate at a current level of approximately 1 mA. The OE driver circuit or OE signal circuit may be used for driving multiple ECL logic gates with cutoff driver circuits. As stated above for multiple bit circuits such as hex buffers and octal buffers a higher power OE driver circuit may be required.

The power required for operation of the ECL logic gate and cutoff driver circuit is substantially greater. The current sinks I3 and I4 typically generate for example sinking currents of 4 mA. With both the current sinks I3 and I4 operating at all times, a total sinking current $I_{EE}$ in addition to other circuit current requirements is flowing at all times. For an ECL octal buffer line driver a total idling current $I_{EE}$ in excess of 64 mA may be required. As the number of output gates increases, the magnitude of this idling current and accompanying power dissipation may be the limiting factor in circuit size and number of gates.

Figure 1A:
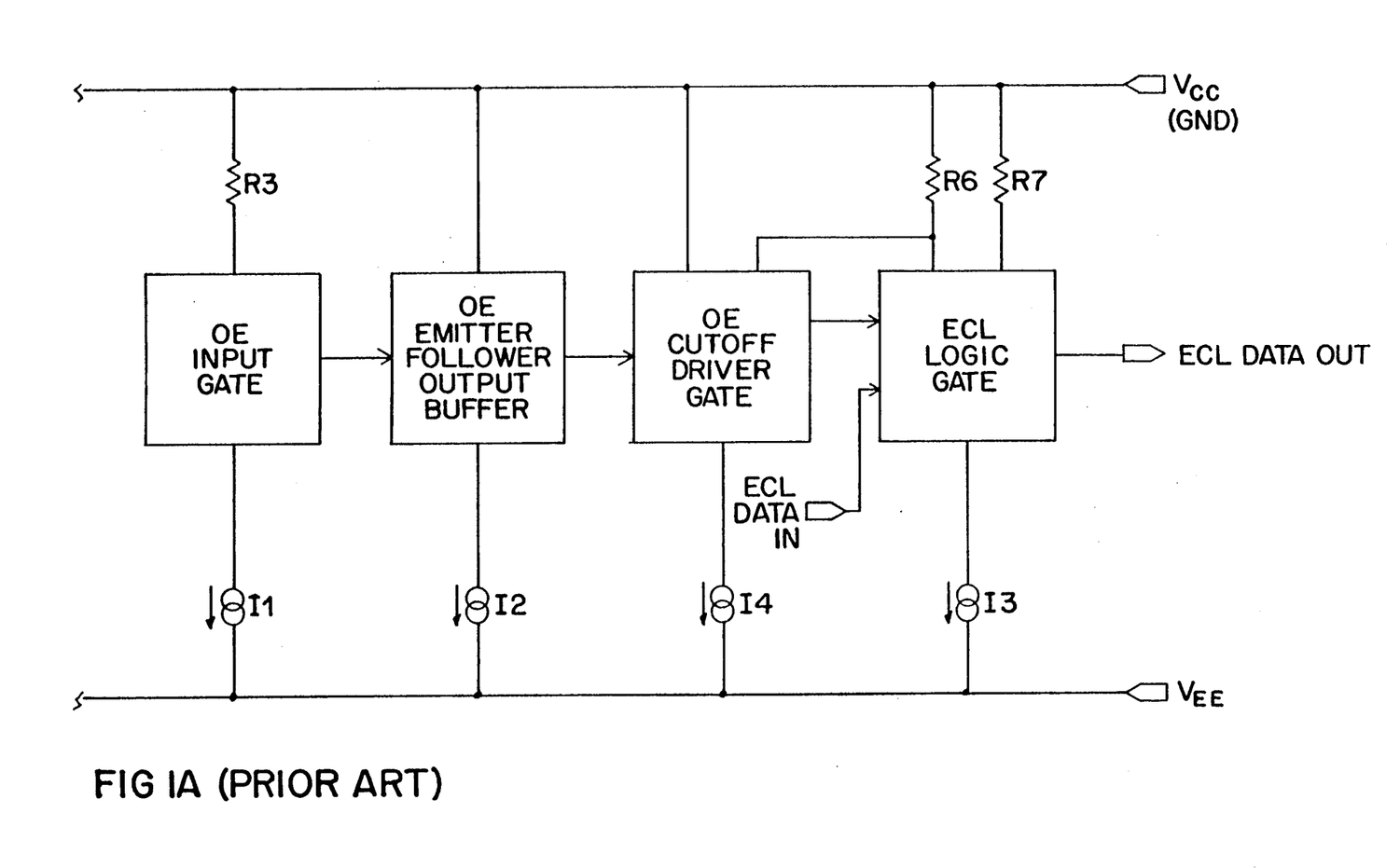
FIG. 1A is a simplified block diagram showing the functional circuit blocks of the prior art circuit of FIG. 1 with most of the circuit components not shown.

The prior art cutoff driver circuit is summarized in the simplified block diagram of FIG. 1A showing the functional circuit blocks of the cutoff driver circuit of FIG. 1 with most of the components deleted. The OE cutoff driver gate is coupled to receive output enable (OE) signals of high and low potential. The OE cutoff driver gate is also operatively coupled to the ECL logic gate for holding the ECL logic gate in the cutoff state in response to one of the high and low OE signals. The OE signal circuit or OE driver circuit for providing OE signals of high and low potential to the OE cutoff driver gate includes the OE input gate and the OE emitter follower output buffer which delivers the OE signals to the OE cutoff driver gate. The functional ECL circuit blocks are provided with respective current sinks including the OE cutoff driver current sink I4 for sinking current from the OE cutoff driver gate.

OBJECTS OF THE INVENTION

It is therefore an object of the present invention to provide a new cutoff driver circuit for ECL logic gates with reduced current requirements and reduced power dissipation.

Another object of the invention is to provide a new current driver circuit with reduced current requirements and reduced power dissipation particularly when the ECL logic gate is out of the cutoff state and the OE cutoff driver circuit is standing by or idling.

A further object of the invention is to provide an OE cutoff driver circuit with a current sink current switch circuit which switches off sinking current from the OE cutoff driver gate when it is standing by or idling.

DISCLOSURE OF THE INVENTION

In order to accomplish these results the present invention provides a current switch circuit operatively coupled to the OE cutoff driver current sink for switching sinking current on and off in phase with the OE signals. The current switch circuit is constructed and arranged to switch on sinking current when the OE cutoff driver gate is holding the ECL logic gate in the cutoff state and to switch off sinking current for reducing power dissipation when the ECL logic gate is out of the cutoff state. Effectively, OE cutoff driver sinking current is eliminated when the OE cutoff driver is standing by or idling.

According to the invention a current switch signal circuit provides current switch signals of high and low potential in phase with the OE signals for operating the current switch circuit. To this end the current switch signal circuit is operatively coupled between the OE signal circuit and the current switch.

In the preferred example embodiment, the current switch circuit is a current mirror circuit having a first current mirror branch circuit for conducting current in response to one of the high and low potential current switch signals. A second current mirror branch circuit is coupled in current mirror configuration with the first current mirror branch circuit. The second current mirror branch circuit operates as the OE cutoff driver current sink.

The first and second current mirror branch circuits are provided respectively by first and second current mirror transistor elements. The emitter area of the second current mirror transistor element is substantially greater than the emitter area of the first current mirror transistor element. As a result, a relatively large sinking current in the second mirror current branch circuit may be controlled and switched by a relatively small controlling current in the first current mirror branch circuit.

The OE signal circuit or OE driver circuit includes the OE input gate having an input for receiving OE signals of high and low potential and a switching output node for delivering OE signals of high and low potential. A first emitter follower output buffer is coupled to the switching output node of the OE input gate for delivering OE signals to the OE cutoff driver gate. The current switch signal circuit is provided by a second emitter follower output buffer coupled to the same switching output node. A feature and advantage of this arrangement is that the current switch signal circuit delivers current switch signals in phase with the OE signals to the current mirror circuit.

According to another aspect of the cutoff driver circuit invention, a current mirror voltage clamp circuit is coupled to a common clamp node of the second emitter follower output buffer and the current mirror circuit. The voltage clamp circuit maintains sufficiently high voltage at the clamp node in response to one of the high and low potential current switch signals so that the first current mirror branch circuit is conducting for switching on sinking current. The voltage clamp circuit also maintains sufficiently low voltage at the clamp node in response to the other of said high and low potential current switch signals so that the first current mirror branch circuit is non-conducting for switching off sinking current. The voltage clamp circuit is implemented by a $2V_{BE}$ clamp circuit or $nV_{BE}$ clamp circuit, where n is equal to or greater than 2, coupled between the common clamp node and the low potential power rail $V_{EE}$. A third emitter follower transistor element is then coupled between the common clamp node and the first current mirror branch circuit.

The OE cutoff driver gate of the cutoff driver circuit includes at least one cutoff driver transistor element coupled for receiving the OE signals of high and low potential and a cutoff reference transistor element coupled for receiving an intermediate potential reference signal. The cutoff driver and reference transistor elements have emitter terminals coupled together at a common emitter node.

The cutoff driver current sink coupled to the common emitter node for sinking current from the OE cutoff driver gate is provided by the current switch circuit. The current switch switches on and off the sinking current in response to current switch signals of high and low potential in phase with the OE signals. A feature and advantage of this arrangement is that the current switch switches on sinking current from the OE cutoff driver gate only when the OE cutoff driver gate is holding the ECL logic gate in the cutoff state. The sinking current switches off when the OE cutoff driver gate is standing by or idling thereby reducing the power requirements and power dissipation by the ECL circuitry.

DESCRIPTION OF PREFERRED EXAMPLE EMBODIMENTS AND BEST MODE OF THE INVENTION

Figure 2:
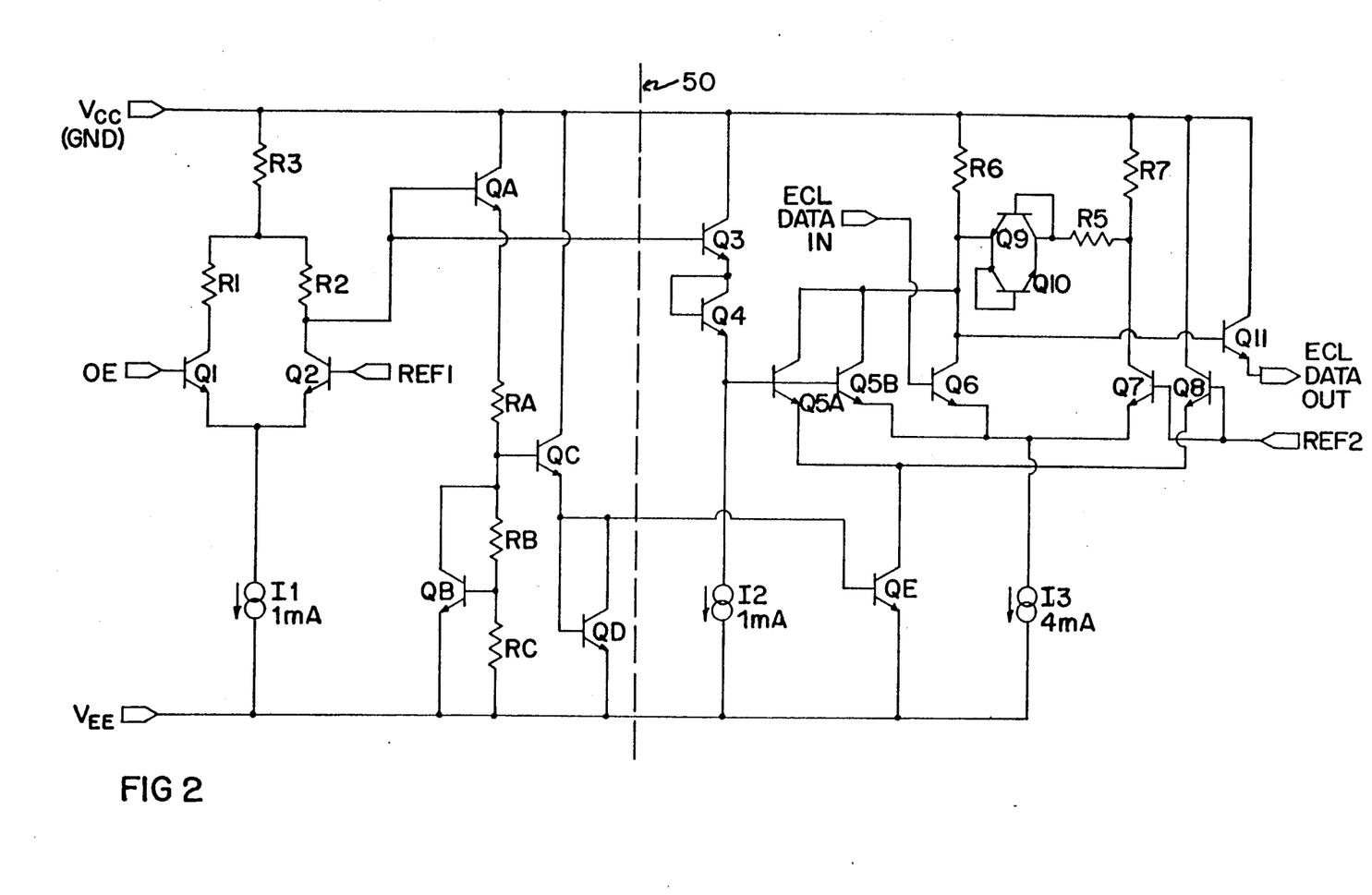
FIG. 2 is a schematic circuit diagram of an ECL logic gate with cutoff driver circuit according to the invention.
Figure 2A:
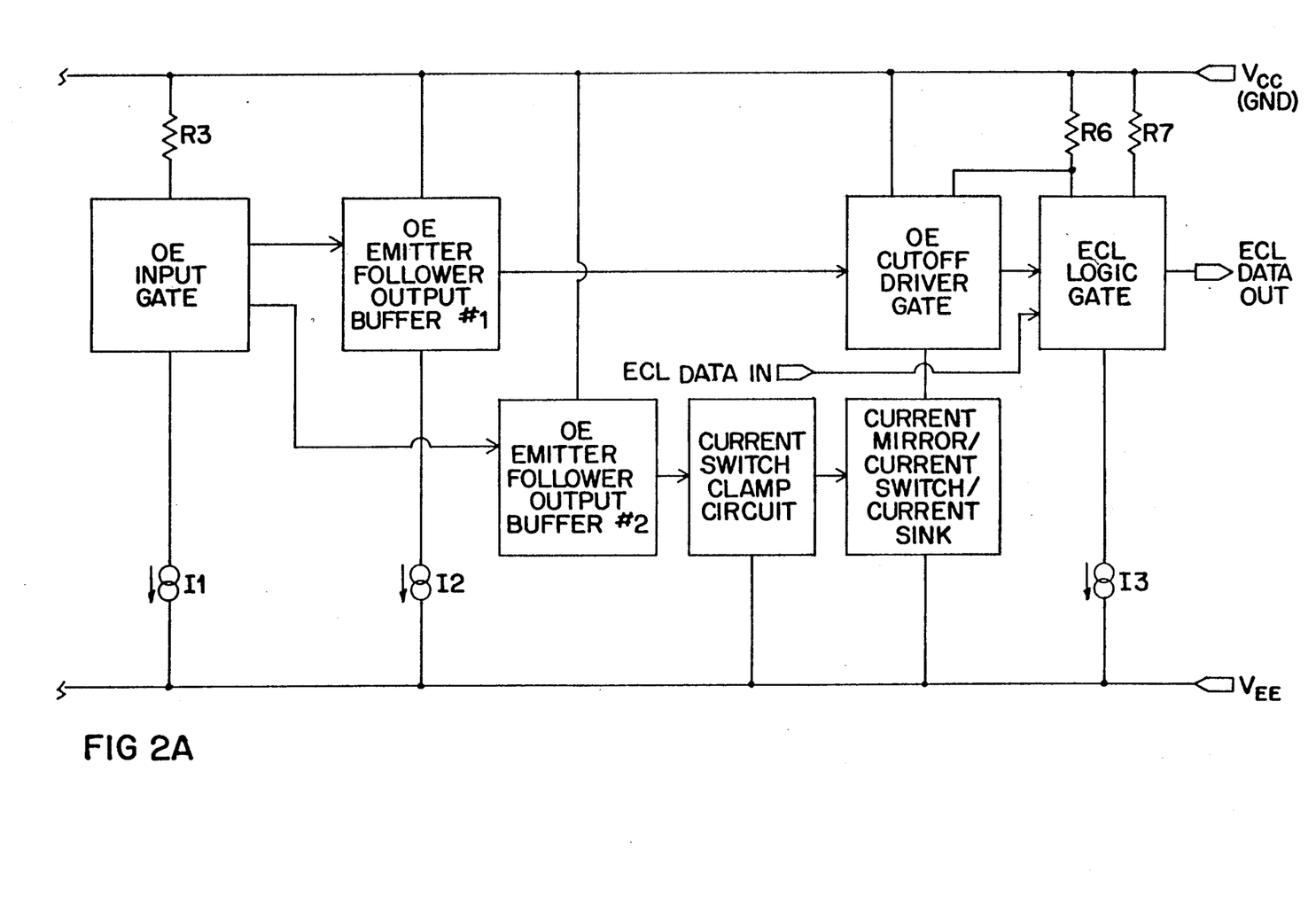
FIG. 2A is a simplified block diagram showing the functional circuit blocks of the circuit of FIG. 2 with most of the circuit components not shown.

An ECL circuit including an ECL logic gate with a cutoff driver circuit according to the invention is illustrated in FIGS. 2 and 2A. The circuit components which perform the same or substantially similar function as described with reference to FIG. 1 are indicated by the same reference numerals or reference designations. Comparing the simplified block diagrams of FIGS. 1A and 2A, it is seen that the primary differences between the circuits of FIG. 2 and FIG. 1 include the substitution of a current mirror current switch circuit for the OE cutoff driver current sink I4. Associated with the current mirror current switch circuit is a current switch clamp circuit and a current switch signal circuit provided by a second OE emitter follower output buffer coupled to the OE input gate. The circuit components for implementing these new functional blocks of FIG. 2 are as follows.

The BCS transistor element QD and transistor element QE are coupled in current mirror configuration and provide the current mirror current switch at the common emitter node of the OE cutoff driver transistor element Q5A and OE cutoff driver reference transistor element Q8. Transistor elements Q5A, Q5B and Q8 form the OE cutoff driver gate as heretofore described. BCS transistor element QD forms the first current mirror branch circuit which conducts the relatively small controlling current. Transistor element QE forms the second current mirror branch circuit which conducts the relatively large sinking current from the common emitter node of the OE cutoff driver gate.

In order to provide the desired ratio of controlling current through first current mirror branch circuit transistor element QD and the sinking current through second current mirror branch circuit transistor element QE, the ratio of emitter areas of the two transistor elements is selected accordingly. By way of example, the emitter area of current sinking transistor element QE is approximately 5 times the emitter area of controlling current transistor element QD. Typically the ratio of emitter areas of the transistor element QE to transistor element QD is in the range of for example 3 to 8. For higher fan-out where the OE signal circuit or OE driver circuit controls additional ECL logic gates and cutoff driver circuits, the controlling current mirror transistor element QD may control additional current sinking current mirror transistor elements.

The first current mirror branch circuit transistor element QD receives current switch signals of high and low potential from a current switch signal circuit provided by a second emitter follower output buffer transistor element QA coupled to the output switching node at the collector terminal of transistor element Q2 of the OE input gate. The current switch signals of high and low potential from the second emitter follower output buffer transistor element QA are therefore in phase with the OE signals from the first emitter follower output buffer transistor element Q3.

The current switch signals of high and low potential from transistor element QA are conditioned by a current mirror voltage clamp circuit. The voltage clamp circuit includes a $2V_{BE}$ clamp circuit provided by trans QB and resistor elements RB and RC. The $2V_{BE}$ clamp circuit is coupled at one end to a clamp node established below resistor RA which is in turn coupled to the emitter node of emitter follower output buffer transistor element QA. The other end of the $2V_{BE}$ clamp circuit is coupled to the low potential power rail $V_{EE}$. A third emitter follower transistor element QC is coupled with its base-emitter circuit between the clamp node and the first current mirror branch circuit. This current mirror voltage clamp circuit arrangement assures that when a high potential switch signal is applied to the first current mirror branch circuit, the $2V_{BE}$ clamp circuit is operating and holding the clamp node at a high clamp potential above the low power rail $V_{EE}$. This high clamp potential is selected to be sufficient to assure that the first current mirror branch circuit transistor element QD is able to conduct the controlling current for turning on the second current mirror branch circuit current sinking transistor element QE.

When the current switch signal from transistor element QA is at low potential, the $2V_{BE}$ clamp circuit collapses. However the potential drop $V_{BE}$ across the base to emitter junction of emitter follower transistor element QC depresses the potential level at the base collector junction of BCS transistor element QD to a level below which diode QD can become conducting. This assures that the controlling current through the first current mirror branch circuit transistor element QD remains off, switching off any sinking current through the second current mirror branch circuit transistor element QE.

As a result of these current mirror voltage clamp functions and because the current switch signals and OE signals are in phase, the current mirror current sinking transistor element QE is switched on for sinking current only when the OE cutoff driver circuit is holding the ECL logic gate in the cutoff state. Otherwise the current mirror current sinking transistor element QE switches off to conserve power and reduce power dissipation. As a result there is effectively no idling sinking current or standby sinking current from the OE cutoff driver gate.

The OE cutoff driver reference transistor element Q8 is retained in the OE cutoff driver gate even though the current sinking current mirror transistor element QE can be switched off. This permits any leakage current through transistor element QE to be drawn through OE reference transistor element Q8 instead of the OE cutoff driver transistor element Q5A. Leakage current passing through the cutoff driver transistor element Q5A may effect the stability of a low potential data signal $V_{OL}$ at the output, ECL DATA OUT. The destabilizing effect of leakage current is thereby avoided.

While the invention has been described with reference to particular example embodiments it is intended to cover all modifications and equivalents within the scope of the following claims.

I claim:

1. A cutoff driver circuit having an OE cutoff driver gate coupled to receive output enable (OE) signals of high and low potential, said OE cutoff driver gate being operatively coupled to an ECL logic gate for holding the ECL logic gate in the cutoff state in response to one of said high and low OE signals, an OE signal circuit for providing OE signals of high and low potential to the OE cutoff driver gate, and an OE cutoff driver current sink for sinking current from the OE cutoff driver gate, comprising:

a current switch circuit operatively coupled to the OE cutoff driver current sink for switching sinking current on and off in phase with the OE signals, said current switch circuit being coupled to switch on sinking current when the OE cutoff driver gate is holding the ECL logic gate int he cutoff state, and to switch off sinking current for reducing power dissipation when the ECL logic gate is out of the cutoff state;

and a current switch signal circuit for providing current switch signals of high and low potential in phase with the OE signals, said current switch signal circuit being operatively coupled between the OE signal circuit and said current switch circuit.

2. The cutoff driver circuit of claim 1 wherein the current switch circuit comprises a current mirror circuit.

3. The cutoff driver circuit of claim 2 wherein the current mirror circuit comprises a current mirror having a first branch circuit coupled to the current switch signal circuit for conducting current in response to one of the high and low potential current switch signals and a second branch circuit comprising said OE cutoff driver current sink.

4. The cutoff driver circuit of claim 3 wherein the current mirror first and second branch circuits comprise respectively first and second current mirror transistor elements, and wherein the emitter area of the second current mirror transistor element is substantially greater than the emitter area of the first current mirror transistor element for controlling and switching a relatively large sinking current in the second branch circuit with a relatively small controlling current in the first branch circuit.

5. The cutoff driver circuit of claim 3 wherein the OE signal circuit comprises an OE input gate having an input for receiving OE signals of high and low potential and a switching output node for delivering OE signals of high and low potential.

6. The cutoff driver circuit of claim 5 wherein the OE signal circuit further comprises a first emitter follower output buffer coupled to said switching output node of the OE input gate for delivering OE signals to the OE cutoff driver gate, and wherein the current switch signal circuit comprises a second emitter follower output buffer coupled to said switching output node for delivering current switch signals in phase with the OE signals to the current mirror circuit.

7. The cutoff driver circuit of claim 6 wherein the second emitter follower output buffer and the first branch circuit of the current mirror are coupled together at a common clamp node and further comprising a current mirror voltage clamp circuit operatively coupled to said common clamp node of the second emitter follower output buffer and the first branch circuit, said voltage clamp circuit comprising voltage drop components selected to maintain sufficiently high voltage at the common clamp node in response to one of the high and low potential current switch signals so that the first branch circuit of the current mirror is conducting for switching on sinking current, and to maintain sufficiently low voltage at the common clamp node in response to the other of said high and low potential current switch signals to that the first branch circuit of the current mirror is non-conducting for switching off sinking current.

8. The cutoff driver circuit of claim 7 wherein the voltage clamp circuit comprises a $nV_{BE}$ potential difference clamp circuit, where n is equal to or greater than 2, coupled between the common clamp node and a low potential power rail, and a third emitter follower transistor element coupled between the common clamp node and the first branch circuit of the current mirror.

9. A cutoff driver circuit for holding the output of an ECL logic gate in the cutoff state comprising:

an OE cutoff driver gate having at least one cutoff driver transistor element coupled for receiving output enable (OE) signals of high and low potential and a cutoff reference transistor element coupled for receiving an intermediate potential reference signal, said cutoff driver and reference transistor elements having emitter terminals coupled together at a common emitter node;

a cutoff driver current sink coupled to the common emitter node for sinking current from the OE cutoff driver gate, said current sink comprising a current switch coupled to switch on and off the sinking current in response to current switch signals of high and low potential;

an OE signal circuit for providing OE signals of high and low potential to the OE cutoff driver transistor element for holding an ECL logic gate in the cutoff state in response to one of said high and low potential OE signals;

an a current switch signal circuit operatively coupled between the OE signal circuit and said cutoff driver current sink current switch for providing current switch signals in phase with the OE signals to the current switch for switching on sinking current from the OE cutoff driver gate when the OE cutoff driver gate is holding an ECL logic gate in the cutoff state, and for switching off sinking current to reduce power dissipation when the ECL logic gate is out of the cutoff state.

10. The cutoff driver circuit of claim 9 wherein the OE signal circuit comprises an OE input gate having an input for receiving OE signals of high and low potential and a switching output node for delivering OE signals of high and low potential;

wherein the OE signal circuit further comprises a first emitter follower output buffer coupled to said switching output node of the OE input gate for delivering OE signals to the OE cutoff driver gate;

wherein the cutoff driver current sink current switch comprises a current mirror circuit;

wherein the current switch signal circuit comprises a second emitter follower output buffer coupled to said switching output node for delivering current switch signals to the current mirror circuit in phase with the OE signals, said second emitter follower output buffer and current mirror circuit being coupled at a common clamp node;

and further comprising a current mirror voltage clamp circuit operatively coupled to the common clamp node of the second emitter follower output buffer and the current mirror circuit.

11. An emitter coupled logic/current mode logic (ECL/CML) logic gate having an input for receiving ECL date signals of high and low potential, an output for delivering ECL data signals, an OE cutoff driver gate for holding the ECL logic gate in the cutoff state in response to one of high and low potential output enable (OE) signals, an OE input gate having an input for receiving OE signals of high and low potential and a switching output node for delivering OE signals of high and low potential, and a first emitter follower output buffer coupled to the switching output node of the OE input gate for delivering said OE signals to the OE cutoff driver gate, the improvement comprising:

a second emitter follower output buffer coupled to the switching output node of the OE input gate for delivering current switch signals of high and low potential in phase with the OE signals from the first emitter follower output buffer;

and a current mirror current switching circuit comprising a current mirror having a first branch circuit operatively coupled to the second emitter follower output buffer for switching on and off a controlling current in the first branch circuit in response to said current switch signals, and a second branch circuit operatively coupled in current mirror configuration with the first branch circuit, said second branch circuit comprising a current sink operatively coupled to the OE cutoff driver gate for switching on and off sinking current from the OE cutoff driver gate in response to said controlling current in the first branch circuit.

12. The ECL/CML logic gate of claim 11 wherein the second emitter follower output buffer and the first branch circuit of the current mirror are coupled together at a common clamp node and further comprising a current mirror voltage clamp circuit operatively coupled to said common clamp node of the second emitter follower output buffer and the first branch circuit, said voltage clamp circuit comprising voltage drop components selected to maintain sufficiently high voltage at the common clamp node in response to one of the high and low potential current switch signals so that the first branch circuit of the current mirror is conducting for switching on sinking current in the second branch circuit, and to maintain sufficiently low voltage at the common clamp node in response to the other of said high and low potential current switch signals so that the first branch circuit is non-conducting for switching off sinking current in the second branch circuit.

13. The ECL/CML logic gate of claim 12 wherein the voltage clamp circuit comprises a 2 $V_{BE}$ potential difference clamp circuit coupled between the common clamp node and a low potential power rail, and a third emitter follower transistor element coupled between the common clamp node and the first branch circuit of the current mirror.

14. An emitter coupled logic/current mode logic (ECL/CML) circuit comprising:

an ECL logic gate having an input for receiving ECL data signals of high and low potential and an output for delivering ECL data signals;

an OE input gate having an input for receiving output enable (OE) signals of high and low potential and a switching output node for delivering OE signals of high and low potential;

a first emitter follower output buffer coupled to said switching output node of the OE input gate for delivering OE signals;

a second emitter follower output buffer coupled to said switching output node of the OE input gate for delivering current switch signals of high and low potential in phase with the OE signals;

an OE cutoff driver gate operatively coupled to the first emitter follower output buffer and to the ECL logic gate for holding the ECL logic gate int he cutoff state in response to one of said high or low potential OE signals;

and a current switch circuit operatively coupled to the second emitter follower output buffer and to the OE cutoff driver gate, said current switch circuit comprising a cutoff driver current sink coupled to the OE cutoff driver gate for switching on sinking current from the OE cutoff driver gate when the OE cutoff driver gate is holding the ECL logic gate in the cutoff state and for switching off sinking current to reduce power dissipation when the ECL logic gate is out of the cutoff state.

15. The ECL/CML circuit of claim 14 wherein the current switch circuit comprises a current mirror circuit.

16. The ECL/CML circuit of claim 15 wherein the current mirror circuit comprises a current mirror having a first branch circuit for conducting current in response to one of the high and low potential current switch signals, and a second branch circuit coupled in current mirror configuration with the first branch circuit, said second branch circuit comprising said OE cutoff driver current sink.

17. The cutoff driver circuit of claim 16 wherein the first and second branch circuits comprise respectively first and second current mirror transistor elements, and wherein the emitter area of the second current mirror transistor element is substantially greater than the emitter area of the first current mirror transistor element for controlling and switching a relatively large sinking current in the second branch circuit with a relatively small controlling current in the first branch circuit.

18. The cutoff driver circuit of claim 17 wherein the second emitter follower output buffer and the first branch circuit of the current mirror are coupled together at a common clamp node and further comprising a current mirror voltage clamp circuit operatively coupled to the common clamp node of the second emitter follower output buffer and first branch circuit.

19. The cutoff driver circuit of claim 18 wherein the current mirror voltage clamp circuit comprises voltage drop components selected to maintain a sufficiently high voltage at the common clamp node in response to one of the high and low potential current switch signals so that the first branch circuit is conducting for switching o n sinking current in the second branch circuit, and to maintain sufficiently low voltage at the common clamp node in response to the other of said high andlow potential current switch signals so that the first branch circuit is non-conducting for switching off sinking current in the second branch circuit.

* * * * *